(12) United States Patent
Zhao et al.

(10) Patent No.: US 10,599,044 B1
(45) Date of Patent: Mar. 24, 2020

(54) DIGITAL LITHOGRAPHY WITH EXTENDED FIELD SIZE

(71) Applicant: Applied Materials, Inc., Santa Clara, CA (US)

(72) Inventors: Guoheng Zhao, Palo Alto, CA (US); Jeremy Rolfe Nesbitt, San Jose, CA (US); Christopher Dennis Bencher, Cupertino, CA (US); Mehdi Vaez-Iravani, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/267,353

(22) Filed: Feb. 4, 2019

(51) Int. Cl.
*G03F 7/20* (2006.01)
*G02B 26/08* (2006.01)

(52) U.S. Cl.
CPC ..... *G03F 7/70291* (2013.01); *G02B 26/0833* (2013.01); *G03F 7/7015* (2013.01); *G03F 7/70075* (2013.01)

(58) Field of Classification Search
CPC ............. G03F 7/70291; G03F 7/70058; G03F 7/70275; G03F 7/70075; G03F 7/7015; G03F 7/70791
See application file for complete search history.

(56) References Cited

U.S. PATENT DOCUMENTS

| | | | |
|---|---|---|---|
| 6,238,852 B1 | 5/2001 | Klosner | |
| 6,870,554 B2 | 3/2005 | Jain | |
| 8,390,786 B2 | 3/2013 | Laidig | |
| 9,519,226 B2 | 12/2016 | Chen et al. | |
| 9,733,573 B2 | 8/2017 | Markle et al. | |
| 2002/0005940 A1* | 1/2002 | Hatada | G03F 7/70275 355/55 |
| 2002/0097495 A1 | 7/2002 | Mei | |
| 2002/0126479 A1* | 9/2002 | Zhai | G02B 5/32 362/244 |
| 2004/0042001 A1 | 3/2004 | Vaez-Iravani et al. | |
| 2004/0075882 A1 | 4/2004 | Meisburger | |
| 2008/0037083 A1 | 2/2008 | Ogasawara | |
| 2009/0046262 A1* | 2/2009 | Okazaki | G03F 7/70275 355/52 |
| 2017/0017165 A1 | 1/2017 | Bencher et al. | |

* cited by examiner

*Primary Examiner* — Steven Whitesell Gordon
(74) *Attorney, Agent, or Firm* — Patterson & Sheridan, LLP; Steven H. Versteeg

(57) ABSTRACT

The present disclosure generally relates to lithography devices comprising an image projection system. The image projection system comprises a fiber bundle coupled to a first homogenizer and a second homogenizer. The first homogenizer is offset from the second homogenizer along a scan direction. The first homogenizer is optically aligned with a first digital micromirror device, and the second homogenizer is optically aligned with a second digital micromirror device. The first digital micromirror device is offset from the second digital micromirror device along the scan direction within an optical field of view of a projection lens. A scan field of the first digital micromirror device overlaps or aligns with a scan field of the second digital micromirror device to eliminate a gap between the scan field of the first digital micromirror device and the scan field of the second digital micromirror device.

20 Claims, 8 Drawing Sheets

DIGITAL LITHOGRAPHY WITH EXTENDED FIELD SIZE

BACKGROUND

Field

Embodiments of the present disclosure generally relate to apparatuses, systems, and methods for processing one or more substrates, and more specifically to apparatuses, systems, and methods for performing photolithography processes.

Description of the Related Art

Photolithography is widely used in the manufacturing of semiconductor devices and display devices, such as liquid crystal displays (LCDs) and organic light-remitting diode (OLED) displays. Large area substrates are often utilized in the manufacture of LCDs and OLEDs. LCDs and OLEDs, or flat panels, are commonly used for active matrix displays, such as computers, touch panel devices, personal digital assistants, cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator, such as an assembly utilizing digital micromirror devices (DMD), exposes selected areas of the light-sensitive photoresist to light as part of a pattern, causing chemical changes to the photoresist in the selective areas to prepare these selective areas for subsequent material removal and/or material addition processes to create the electrical features. However, the DMDs utilized with this process are generally quite small, having a resolution that is far smaller than a field size of a projection lens used with exposing the selected areas. Because of the DMD size limit, numerous pattern generators or projection units are needed to achieve desired throughput. As the number of projection units increases, the cost, reliability, and alignment between the projection units becomes increasingly difficult to manage.

In order to continue to provide display devices and other devices at the prices demanded by consumers, new apparatuses and approaches are needed to precisely and cost-effectively create patterns on substrates.

SUMMARY

The present disclosure generally relates to lithography devices comprising an image projection system. The image projection system comprises a fiber bundle coupled to a first homogenizer and a second homogenizer. The first homogenizer is offset from the second homogenizer along a scan direction. The first homogenizer is optically aligned with a first digital micromirror device, and the second homogenizer is optically aligned with a second digital micromirror device. The first digital micromirror device is offset from the second digital micromirror device along the scan direction within an optical field of view of a projection lens. A scan field of the first digital micromirror device overlaps or aligns with a scan field of the second digital micromirror device to eliminate a gap between the scan field of the first digital micromirror device and the scan field of the second digital micromirror device.

In one embodiment, an image projection system comprises a light source, a fiber bundle coupled to the light source, a first light pipe coupled to the fiber bundle, and a second light pipe coupled to the fiber bundle. The second light pipe is offset from the first light pipe. The image projection system further comprises a first digital micromirror device optically aligned with the first light pipe. The image projection system further comprises a second digital micromirror device disposed adjacent to the first digital micromirror device within a plane. The second digital micromirror device is optically aligned with the second light pipe.

In another embodiment, an image projection system comprises a light source, a fiber bundle coupled to the light source, a first homogenizer coupled to the fiber bundle, and a second homogenizer coupled to the fiber bundle. The second homogenizer is offset from the first homogenizer. The image projection system further comprises a first digital micromirror device optically aligned with the first homogenizer. The first digital micromirror device is coupled to a first prism. The image projection system further comprises a second digital micromirror device disposed adjacent to the first digital micromirror device within a plane. The second digital micromirror device is optically aligned with the second homogenizer. The second digital micromirror device is coupled to a second prism.

In yet another embodiment, an image projection system comprises a first fiber bundle, a first prism mirror coupled to the first fiber bundle, and a first homogenizer coupled to the first prism mirror. The first homogenizer is disposed at a 90 degree angle to the first fiber bundle. The image projection system further comprises a second fiber bundle disposed adjacent to the first fiber bundle, a second prism mirror coupled to the second fiber bundle, and a second homogenizer coupled to the second prism mirror. The second homogenizer is disposed at a 90 degree angle to the second fiber bundle. The image projection system further comprises a first digital micromirror device optically aligned with the first homogenizer. The image projection system further comprises a second digital micromirror device disposed adjacent to the first digital micromirror device within a plane. The second digital micromirror device is optically aligned with the second homogenizer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to lithography devices comprising an image projection system. The image projection system comprises a fiber bundle coupled to a first homogenizer and a second homogenizer. The first homogenizer is offset from the second homogenizer along a scan direction. The first homogenizer is optically aligned with a first digital micromirror device, and the second homogenizer is optically aligned with a second digital micromirror device. The first digital micromirror device is offset from the second digital micromirror device along the scan direction within an optical field of view of a projection lens. A scan field of the first digital micromirror device overlaps or aligns with a scan field of the second digital micromirror device to eliminate a gap between the scan field of the first digital micromirror device and the scan field of the second digital micromirror device.

Figure 1A:
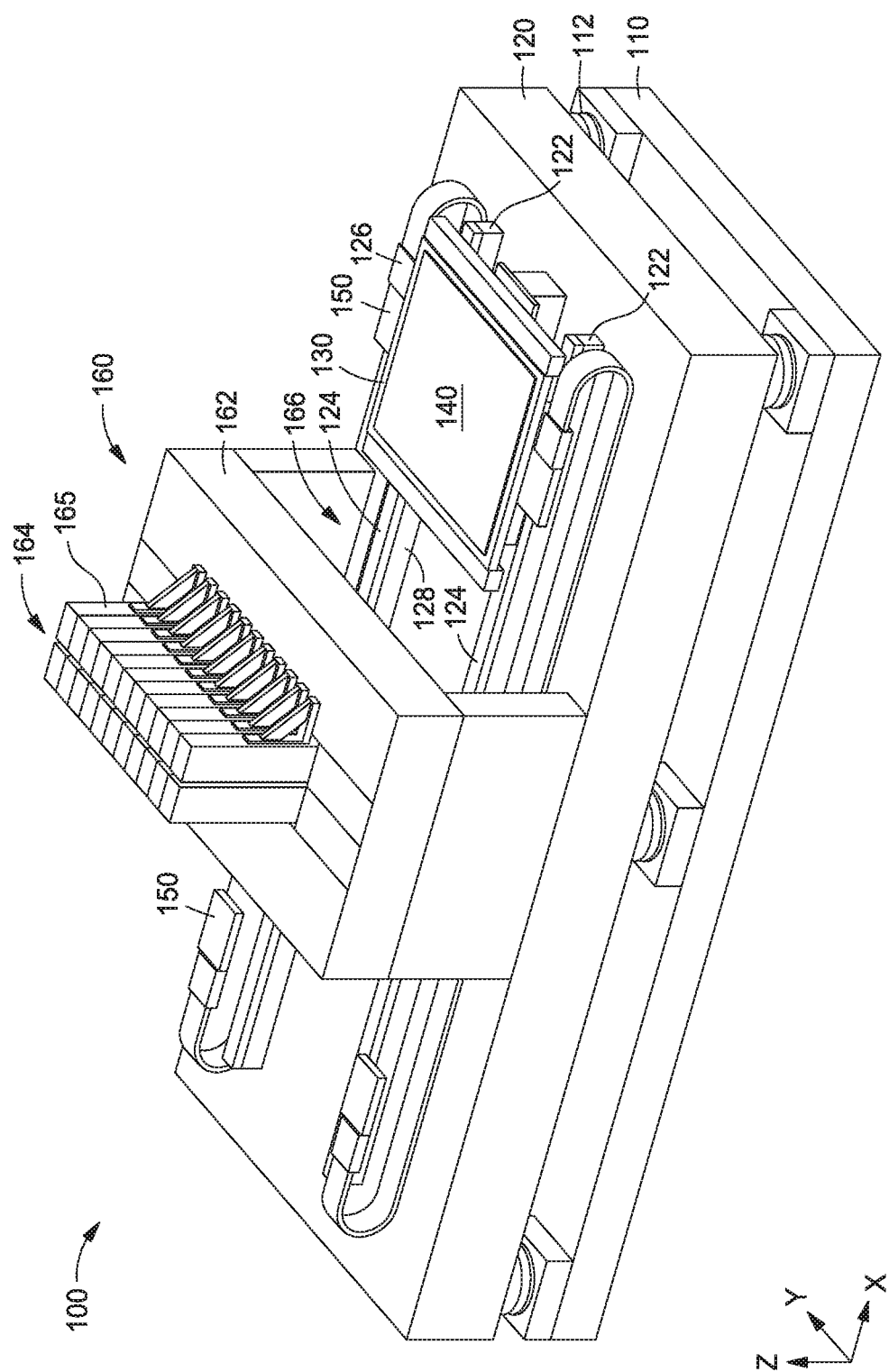
FIG. 1A is a perspective view of a photolithography system, according to one embodiment.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example Alkaline Earth Boro-Aluminosilicate, used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly(methyl methacrylate), poly (methyl glutarimide), and SU-8. In this manner, the pattern is created on a surface of the substrate 140 to form the electronic circuitry.

The system 100 includes a pair of supports 122 and a pair of tracks 124. The pair of supports 122 is disposed on the slab 120, and, in one embodiment, the slab 120 and the pair of supports 122 are a single piece of material. The pair of tracks 124 is supported by the pair of the supports 122, and the stage 130 moves along the tracks 124 in the x-direction. In one embodiment, the pair of tracks 124 is a pair of parallel magnetic channels. As shown, each track 124 of the pair of tracks 124 is linear. In another embodiment, air bearings are utilized for high accurate non-contact motion, and linear motors are configured to provide the force to move the stage 130 back and forth in the x-direction and the y-direction. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIG. 2A). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the x-direction from a loading position, as shown in FIG. 1A, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or z-axis. The angular position measurement can be used to hold the angular position constant during scanning by means of a servo mechanism or it can be used to apply corrections to the positions of the patterns being written on the substrate 140 by the image projection apparatus 270, 281, shown in FIG. 2A and FIG. 2B. These techniques may be used in combination.

Figure 1B:
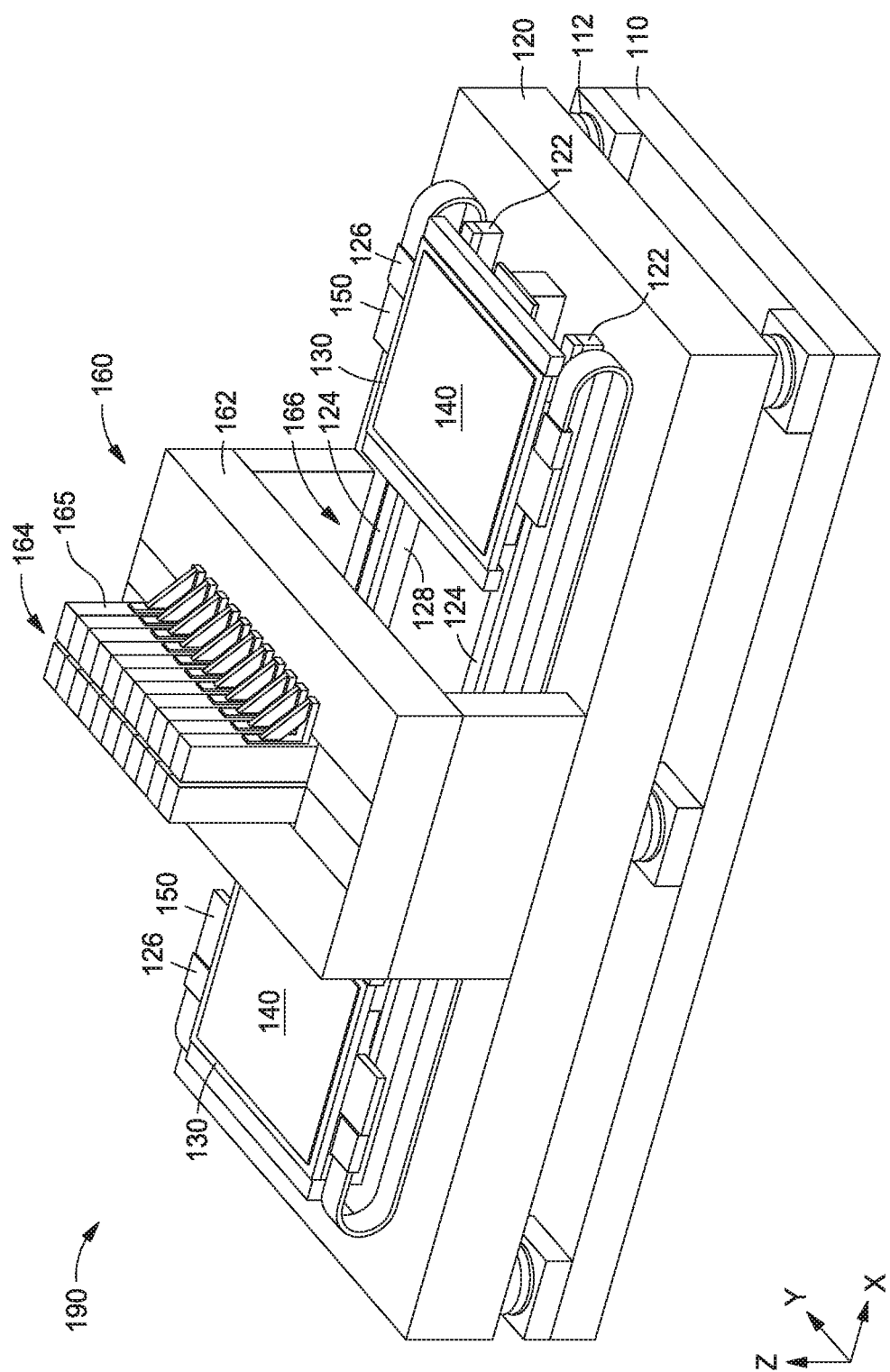
FIG. 1B is a perspective view of a photolithography system having two stages, according to another embodiment.

FIG. 1B is a perspective view of a photolithography system 190 according to embodiments disclosed herein. The system 190 is similar to the system 100; however, the system 190 includes two stages 130. Each of the two stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
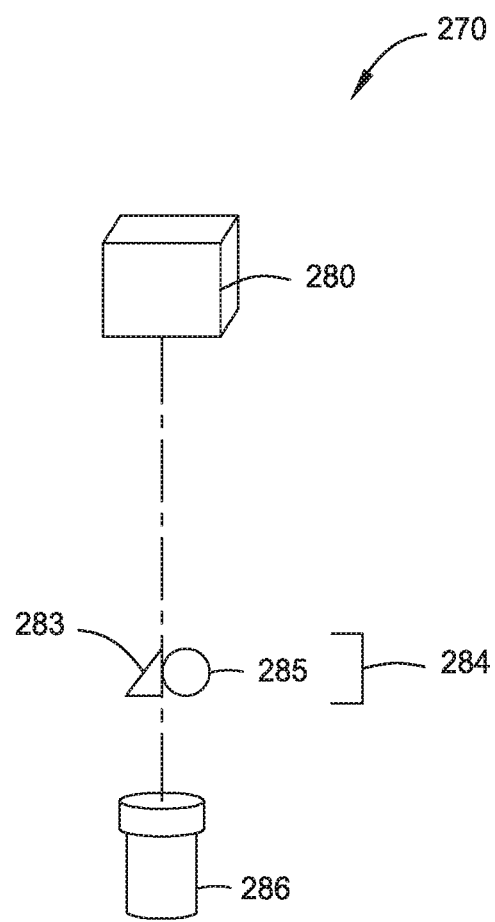
FIG. 2A is a perspective schematic view of an image projection apparatus, according to one embodiment.

FIG. 2A is a perspective schematic view of an image projection apparatus 270 according to one embodiment, which is useful for a photolithography system, such as system 100 or system 190. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, OLEDs, microLEDs, digital micromirror devices (DMDs), liquid crystal displays (LCDs), and vertical-cavity surface-emitting lasers (VCSELs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 190 is correct or within an predetermined tolerance. The projection optics 286, such as one or more lenses, is used to project the light onto the substrate, such as the substrate 140.

Figure 2B:
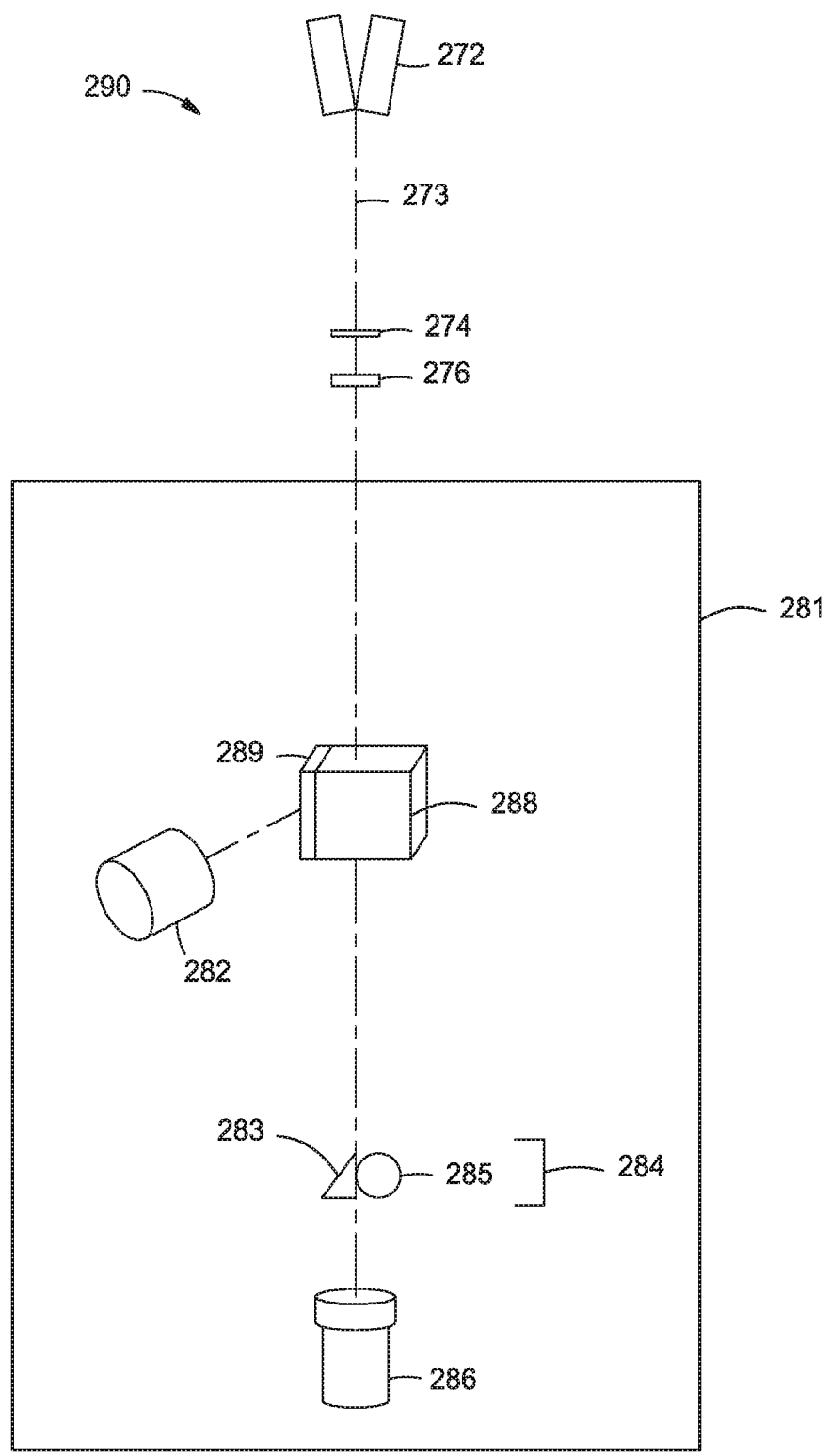
FIG. 2B is a perspective schematic view of an image projection system utilizing one or more DMDs, according to another embodiment.

FIG. 2B is an image project apparatus 281 according to embodiments described herein. In the embodiment shown in FIG. 2B, the image projection apparatus 281 uses one or more DMDs 289 as the spatial light modulator(s). The image projection apparatus 281 is part of an image projection system 290, which includes a light source 272, an aperture 274, a lens 276, a TIR prism assembly 288, one or more DMDs 289 (one is shown), and a light dump 282, in addition to the alignment and inspection system 284 and the projection optics 286. The light source 272 is any suitable light source, such as a light emitting diode (LED), laser diodes, or a laser, capable of producing a light having predetermined wavelength. In one embodiment, the predetermined wavelength is in the blue or near ultraviolet (UV) range, such as less than about 450 nm. The TIR prism assembly 288 includes a plurality of reflective surfaces, and may be a total internal reflection (TIR) prism. The projection lens 286 is, as an example, a 10× objective lens.

During operation of the image projection apparatus 281 shown in FIG. 2B, a light beam 273 having a predetermined wavelength, such as a wavelength in the blue range, is produced by the light source 272. The light beam 273 is reflected to the DMD 289 by the TIR prism assembly 288. The DMD includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 289 by the controller (not shown). When the light beam 273 reaches the mirrors of the DMD 289, the mirrors that are at "on" position reflect the light beam 273, i.e., forming the plurality of write beams, to the projection lens 286. The projection lens 286 then projects the write beams to the surface of the substrate 140. The mirrors that are at "off" position reflect the light beam 273 to the light dump 282 instead of the surface of the substrate 140.

Figure 3A:
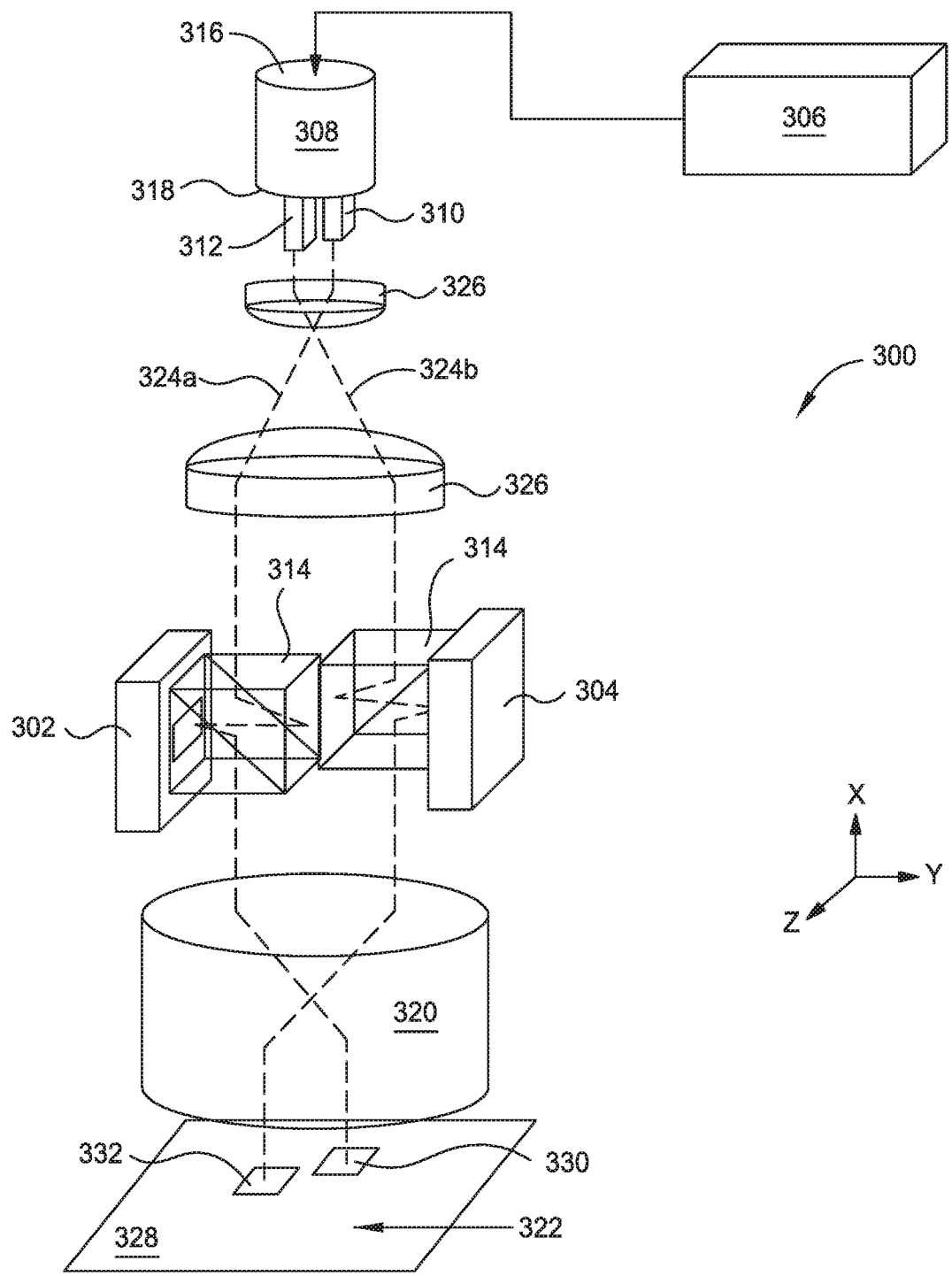
FIG. 3A illustrates an image projection system utilizing a plurality of staggered DMDs, according to one embodiment.

FIG. 3A illustrates an image projection system 300 utilizing staggered DMDs, according to one embodiment. The image projection system 300 may be the image projection system 290 of FIG. 2B.

The image projection system 300 comprises a first DMD 302 and a second DMD 304. The first DMD 302 and the second DMD 304 are each independently coupled to a prism 314, such as a TIR prism assembly 288 of FIG. 2B. The first DMD 302 and the second DMD 304 are disposed in the same plane, but are offset along the scan direction 322 to provide sufficient clearance for the TIR prisms 314 and mechanical interface. In other words, the first DMD 302 and the second DMD 304 are offset along the z-axis. The first DMD 302 and the second DMD 304 are staggered within the optical field of view of a projection lens 320.

Figure 3B:
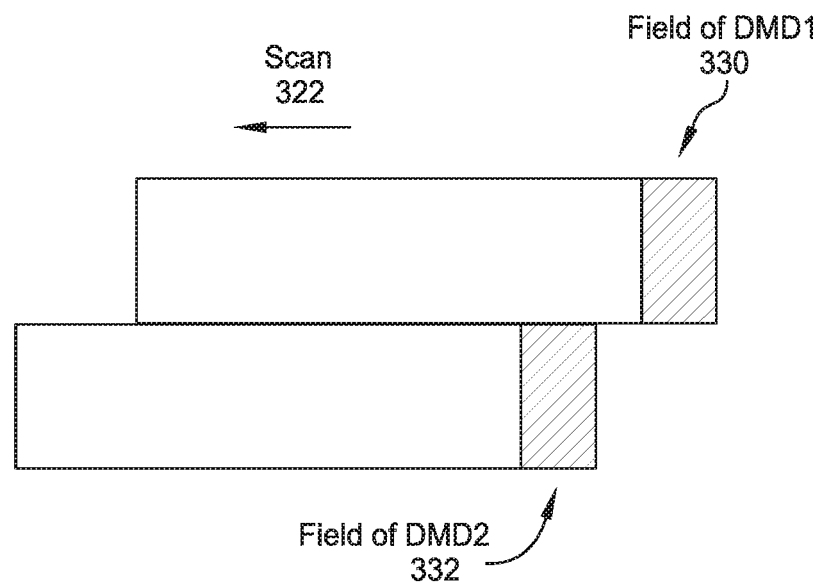
FIG. 3B illustrates the scan fields of a plurality of staggered DMDs of an image projection system, according to one embodiment.

FIG. 3B illustrates the scan fields 330, 332 of the staggered DMDs 302, 304, according to one embodiment. As shown in FIG. 3B, the scan field 330 of the first DMD 302 and the scan field 332 of the second DMD 304 overlap or align such that there is no gap between the scan fields 330, 332.

Figure 3C:
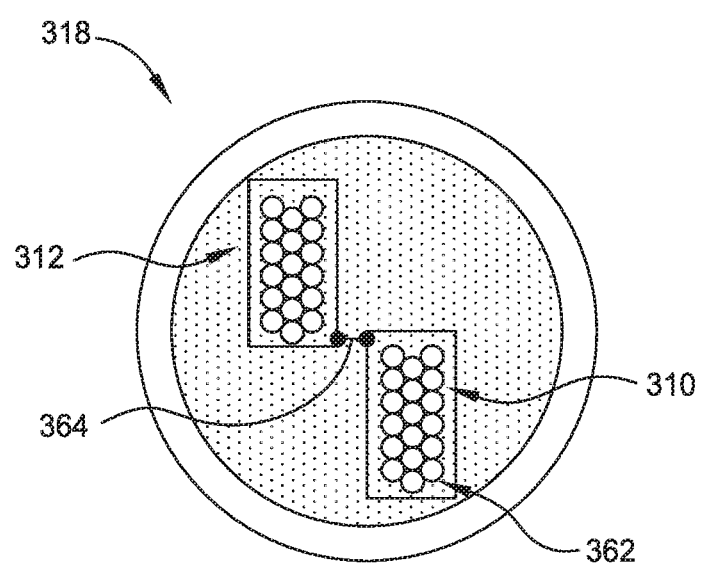
FIG. 3C illustrates an output end of a fiber bundle of an image projection system, according to one embodiment.

The image projection system 300 of FIG. 3A further comprises a light source 306 coupled to a fiber bundle 308. Specifically, the light source 306 is coupled to an input end 316 of the fiber bundle 308. The input end 316 of the fiber bundle 308 may be round to maximize light coupling efficiency; however, the input end 316 can be any shape that optimally matches the shape of the input beam. The output end 318 of fiber bundle 308 is shaped into two separate rectangular fiber arrays, as shown in FIG. 3C. The light source 306 is any suitable light source, and may be lasers or lamps. The light source 306 may be the light source 272 of FIG. 2B.

A first homogenizer 310 and a second homogenizer 312 are coupled to an output end 318 of the fiber bundle 308. The shape of the homogenizers 310, 312 is similar the fiber array layout of the output end of fiber bundle 308. Such a configuration can maximize light coupling efficiency and light intensity uniformity. The output end 318 is the end disposed opposite from the input end 316. The first homogenizer 310 and the second homogenizer 312 may be light pipes, or other types of homogenizers, such as lens arrays, or holographic diffusers. The first homogenizer 310 and the second homogenizer 312 are optically aligned with or match the field shape and location of the first DMD 302 and the second DMD 304, respectively, to eliminate a loss of light. As such, the first homogenizer 310 and the second homogenizer 312 are disposed in the same plane, but are offset along the scan direction 322. In other words, the first homogenizer 310 and the second homogenizer 312 are offset along the z-axis.

FIG. 3C illustrates the output end 318 of the fiber bundle 308, according to one embodiment. The output end 318 shown in FIG. 3C illustrates the first homogenizer 310 being offset from the second homogenizer 312. The first homogenizer 310 and the second homogenizer 312 are spaced or offset from one another by a distance 364 of about 1 mm. A smaller offset distance 364 between the first homogenizer 310 and the second homogenizer 312 enables a more efficient use of the field of the projection lens 320. A layout of an array of fibers 362 at the output end 318 of fiber bundle 308 may be shaped into two rectangular areas, as shown in FIG. 3C. The shape and size of the two arrays of fibers 362 match the size and shape of the first and second homogenizers 310, 312 to optimize the light coupling efficiency and the light intensity uniformity.

Both the first homogenizer 310 and the second homogenizer 312 are proportional to an active area of the first DMD 302 and the second DMD 304, respectively. The positions of the first homogenizer 310 and the second homogenizer 312 are proportionally and optically aligned with the two DMDs 302, 304 such that each output 310, 312 illuminates one DMD 302, 304. For example, the first homogenizer 310 is proportionally and optically aligned with the first DMD 302 to illuminate the first DMD 302. Similarly, the second homogenizer 312 is proportionally and optically aligned with the second DMD 304 to illuminate the second DMD 304. Since the first and second homogenizers 310, 312 are proportionally and optically aligned with the first and second DMDs 302, 304, a smaller offset between the DMDs 302, 304 further allows a more efficient use of the field of the projection lens 320.

The fiber bundle 308 delivers illumination light to the first homogenizer 310 and the second homogenizer 312. The first homogenizer 310 and the second homogenizer 312 split the light into two light beams 324a and 324b, as shown in FIG. 3A. The light beams 324a, 324b may pass through one or more lenses 326 before traveling to the TIR prisms 314 coupled to the first and second DMDs 302, 304. While two lenses 326 are shown, any number of lenses 326 may be utilized.

The one or more lenses 326 may alter the path of the light beams 324a, 324b. Because the first homogenizer 310 and the second homogenizer 312 are offset, the light beams 324a, 324b do not cross paths when altered by the one or more lenses 326. The light beams 324a, 324b then travel to the TIR prisms 314 and the first and second DMDs 302, 304, as the first DMD 302 and the second DMD 304 are optically aligned with first homogenizer 310 and the second homogenizer 312, respectively.

After passing through the TIR prisms 314 and the first and second DMDs 302, 304, the light beams 324a, 324b travel though the projection lens 320. The projection lens 320 may alter the path of the light beams 324a, 324b before traveling to a substrate 328. Because the first and second homogenizers 310, 312 and the first and second DMDs 302, 304 are offset, the light beams 324a, 324b do not overlap on the substrate 328 when projected by the projection lens 320. The light beams 324a, 324b travel across the substrate 328 in the scan direction 322 to expose selected areas of a light-sensitive photoresist on the substrate 328.

The scan field 330 of the first DMD 302 and the scan field 332 of the second DMD 304 overlap or align to eliminate a gap between the scan fields 330, 332, as shown in FIG. 3B, effectively extending the width of the total field size. If the scan field 330 of the first DMD 302 and the scan field 332 of the second DMD 304 overlap, the overlap may be by only a few pixels, such as by about 5 pixels to about 500 pixels. In another embodiment, the overlap may be between about 5 pixels to about 1000 pixels, or up to about half of the total scan field width. Field size may be defined as the number of resolvable spots, or field of view, divided by optical resolution. As such, the projection field of the image projection system 300 is expanded without increasing the size of the DMDs 302, 304. The expanded field size eliminates or reduces the need for multiple projection units while still achieving the desired throughput, increasing the reliability of the image projection system 300 and decreasing costs and alignment issues.

Figure 4:
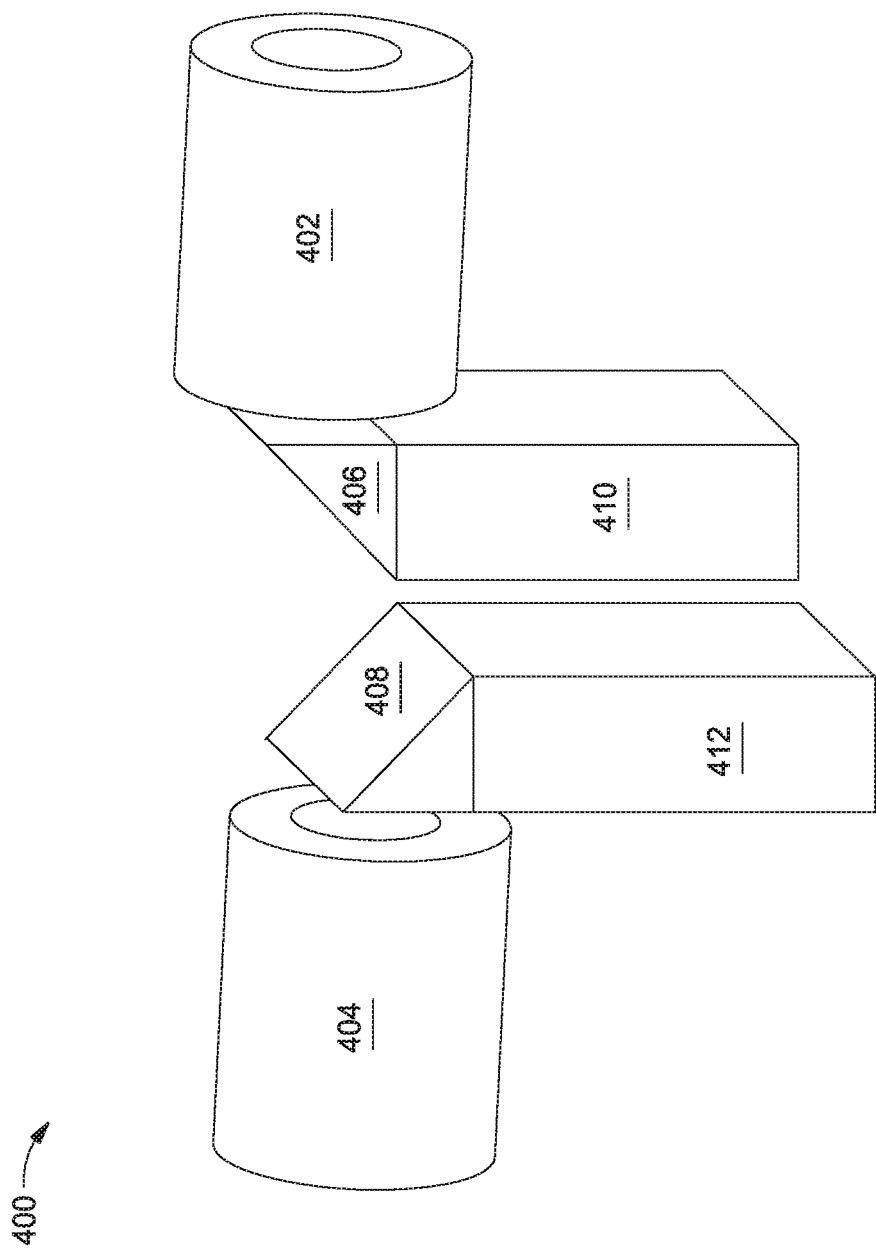
FIG. 4 illustrates a light arrangement utilizing a first fiber bundle and a second fiber bundle for use in an image projection system, according to another embodiment.

FIG. 4 illustrates a light arrangement 400 utilizing a first fiber bundle 402 and a second fiber bundle 404 for use in an image projection system, according to another embodiment. The light arrangement 400 may be utilized with the image projection system 300 of FIG. 3A. The first fiber bundle 402 and the second fiber bundle 404 may each independently be the fiber bundle 308 of FIG. 3A.

In the light arrangement 400, the first fiber bundle 402 is coupled to a first prism mirror 406, and the second fiber bundle 404 is coupled to a second prism mirror 408. The first prism mirror 406 is coupled to a first homogenizer 410, and the second prism mirror 408 is coupled to a second homogenizer 412. The first homogenizer 410 and the second homogenizer 412 may be the first homogenizer 310 and the second homogenizer 312 of FIG. 3A. The first homogenizer 410 and the second homogenizer 412 may be light pipes, or other types of homogenizers, such as lens arrays, or holographic diffusers.

The first homogenizer 410 is disposed at a 90 degree angle to the first fiber bundle 402. The first prism mirror 406 reflects or directs light from a light source (not shown) from the first fiber bundle 402 into the first homogenizer 410. Similarly, the second homogenizer 404 is disposed at a 90 degree angle to the second fiber bundle 404. The second prism mirror 408 reflects or directs light from a light source (not shown) into the second homogenizer 412. The first fiber bundle 402 and the second homogenizer 404 may be coupled to the same, common light source, or the first fiber bundle 402 and the second homogenizer 404 may be coupled to two, distinct light sources. The first fiber bundle 402, the first prism mirror 406, and the first homogenizer 410 are collectively offset along a scan direction from the second fiber bundle 404, the second prism mirror 408, and the second homogenizer 412.

The first and second homogenizers 410, 412 may direct light beams received from the first and second fiber bundles 402, 404 through one or more lenses, two DMDs, and a projection lens onto a substrate, like shown in FIG. 3A, and such as the one or more lenses 326, the first and second DMDs 302, 304, and the projection lens 320 of FIG. 3A. Utilizing the first and second prism mirrors 406, 408 to direct the light from the first and second fiber bundles 402, 404 into the first and second homogenizers 410, 412 allows sufficient mechanical clearance for the fiber bundles 402, 404 and further minimizes the distance between the homogenizers 410, 412.

Figure 5B:
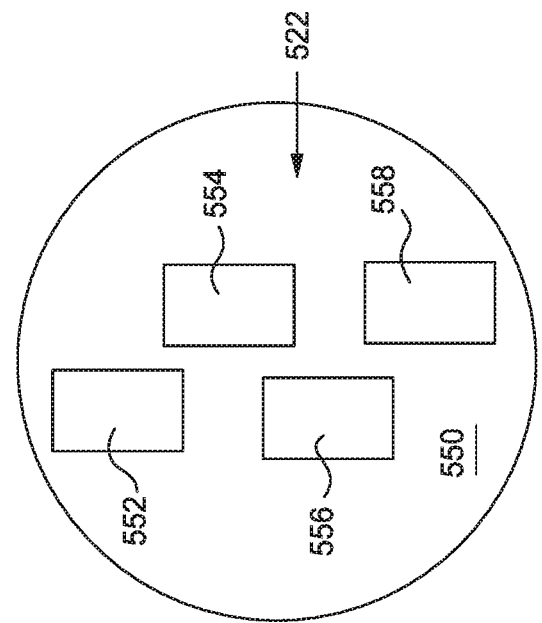
FIG. 5B illustrates the scan fields of the plurality of DMDs on a substrate, according to one embodiment.
Figure 5A:
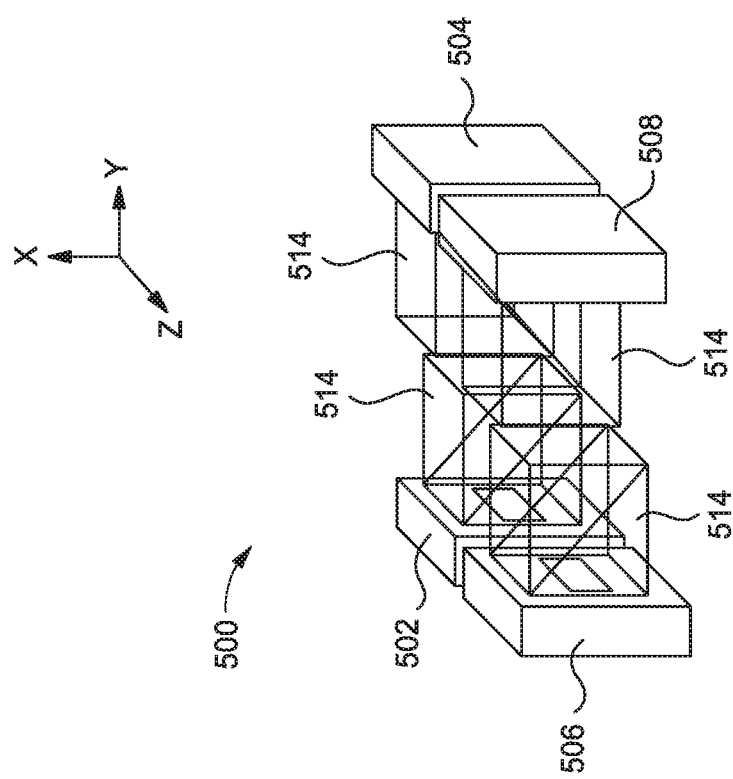
FIG. 5A illustrates a spatial light modulator arrangement utilizing a plurality of DMDS for use in an image projection system, according to another embodiment.

FIG. 5A illustrates a spatial light modulator arrangement 500 utilizing a plurality of DMDS for use in an image projection system, according to one embodiment. The spatial light modulator arrangement 500 may be used in the image projection system 300 of FIG. 3A. The spatial light modulator arrangement 500 of FIG. 5A comprises a first DMD 502, a second DMD 504, a third DMD 506, and a fourth DMD 508, with each of the DMDs 502-508 being independently coupled to a prism 514. Each DMD 502-208 is offset along the z-axis from the other DMDS 502-508, and the DMDS 502-508 are all disposed within the same plane. Each DMD 502-508 is staggered with respect to one another inside the optical field of view of a projection lens, such as the projection lens 320 of FIG. 3A.

The first DMD 502, the second DMD 504, the third DMD 506, and the fourth DMD 508 have an offset along the scan direction 522 (shown in FIG. 5B) to provide enough clearance for the prisms 514 and mechanical interface. Each of the DMDs 502-508 may individually be proportionally and optically aligned with a homogenizer or light pipe. For example, four homogenizers may be disposed on a fiber bundle offset to one another, with each of the four homogenizers being proportionally and optically aligned with the four DMDs 502-508. While four DMDs 502-508 are shown in FIG. 5A, any number of DMDs and corresponding number of homogenizers may be included or combined in a similar arrangement, for example, 3, 5, or 6 DMDs may be included.

FIG. 5B illustrates the scan fields 552-558 of the plurality of DMDs 502-508 on a substrate 550, according to one embodiment. Specifically, FIG. 5B illustrates a first scan field 552 corresponding to the first DMD 502, a second scan field 554 corresponding to the second DMD 504, a third scan field 556 corresponding to the third DMD 506, and a fourth scan field 558 corresponding to the fourth DMD 508.

In FIG. 5B, the first scan field 552 overlaps or aligns with the second scan field 554 to eliminate a gap between the scan fields 552, 554 in the scan direction 522. If first scan field 552 and the second scan field 554 overlap, the overlap may be between about 5 pixels to about 1000 pixels. The second scan field 554 further overlaps or aligns with the third scan field 556 to eliminate a gap between the scan fields 554, 556 in the scan direction 522. If second scan field 554 and the third scan field 556 overlap, the overlap may be between about 5 pixels to about 1000 pixels. The third scan field 556 overlaps or aligns with the fourth scan field 558 to eliminate a gap between the scan fields 556, 558 in the scan direction 522. If third scan field 556 and the fourth scan field 558 overlap, the overlap may be between about 5 pixels to about 1000 pixels.

Utilizing a plurality of DMDs having overlapping or aligned scan fields with a single projection lens enables the projection field of the image projection system to be expanded without increasing the size of the DMDs. The expanded field size eliminates or reduces the need for multiple projection units while still achieving the desired throughput, which increases the overall reliability of the image projection system and decreases costs and alignment issues. As such, the number of parallel projection units utilized in the image projection system can be reduced. Furthermore, aligning the homogenizers with the field shape and location of the DMDs eliminates a loss of light in the image projection apparatus, further increasing the manufacturing throughput.

While the foregoing is directed to embodiments of the present disclosure, other and further embodiments of the disclosure may be devised without departing from the basic scope thereof, and the scope thereof is determined by the claims that follow.

What is claimed is:

1. An image projection system, comprising:
   a light source;
   a fiber bundle coupled to the light source;
   a first homogenizer coupled to the fiber bundle;
   a second homogenizer coupled to the fiber bundle, the second homogenizer being offset from the first homogenizer;
   a first digital micromirror device optically aligned with the first homogenizer;
   a second digital micromirror device disposed adjacent to the first digital micromirror device within a plane, the second digital micromirror device being optically aligned with the second homogenizer, wherein the first digital micromirror device is offset from the second digital micromirror device along a scan direction within the plane; and
   a projection lens, wherein the first digital micromirror device and the second digital micromirror device are disposed between the projection lens and the fiber bundle, and wherein the first digital micromirror device and the second digital micromirror device are offset within an optical field of view of the projection lens.

2. The image projection system of claim 1, wherein a scan field of the first digital micromirror device overlaps or aligns with a scan field of the second digital micromirror device to eliminate a gap between the scan field of the first digital micromirror device and the scan field of the second digital micromirror device.

3. The image projection system of claim 1, further comprising one or more lenses disposed between the first digital micromirror device and the first homogenizer.

4. The image projection system of claim 1, further comprising:
   a third homogenizer coupled to the fiber bundle, the third homogenizer being offset from the first and second homogenizers;
   a fourth homogenizer coupled to the fiber bundle, the fourth homogenizer being offset from the first, second, and third homogenizers;
   a third digital micromirror device disposed adjacent to the first digital micromirror device within the plane, the third digital micromirror device being optically aligned with the third homogenizer; and
   a fourth digital micromirror device disposed adjacent to the second digital micromirror device within the plane, the fourth digital micromirror device being optically aligned with the fourth homogenizer.

5. The image projection system of claim 1, wherein the first homogenizer is offset from the second homogenizer by a distance of about 1 mm.

6. The image projection system of claim 1, wherein a first scan field of the first digital micromirror device aligns or overlaps with a second scan field of the second digital micromirror device by about 5 pixels to about 1,000 pixels.

7. An image projection system, comprising:
   a light source;
   a fiber bundle coupled to the light source;
   a first homogenizer coupled to the fiber bundle;
   a second homogenizer coupled to the fiber bundle, the second homogenizer being offset from the first homogenizer;
   a first digital micromirror device optically aligned with the first homogenizer, wherein the first digital micromirror device is coupled to a first prism;
   a second digital micromirror device disposed adjacent to the first digital micromirror device within a plane, the second digital micromirror device being optically aligned with the second homogenizer, wherein the second digital micromirror device is coupled to a second prism, and wherein the first digital micromirror device is offset from the second digital micromirror device along a scanning direction within the plane; and a projection lens, wherein the first digital micromirror device and the second digital micromirror device are disposed between the projection lens and the fiber bundle, and wherein the first digital micromirror device and the second digital micromirror device are offset within an optical field of view of the projection lens.

8. The image projection system of claim 7, wherein the first homogenizer and the second homogenizer are lens arrays or holographic diffusers.

9. The image projection system of claim 7, wherein a scan field of the first digital micromirror device overlaps or aligns with a scan field of the second digital micromirror device to eliminate a gap between the scan field of the first digital micromirror device and the scan field of the second digital micromirror device.

10. The image projection system of claim 7, further comprising one or more lenses disposed between the first digital micromirror device and the light source.

11. The image projection system of claim 7, further comprising:
a third homogenizer coupled to the fiber bundle, the third homogenizer being offset from the first and second homogenizers;
a fourth homogenizer coupled to the fiber bundle, the fourth homogenizer being offset from the first, second, and third homogenizers;
a third digital micromirror device disposed adjacent to the first digital micromirror device within the plane, the third digital micromirror device being optically aligned with the third homogenizer; and
a fourth digital micromirror device disposed adjacent to the second digital micromirror device within the plane, the fourth digital micromirror device being optically aligned with the fourth homogenizer.

12. The image projection system of claim 7, wherein the first homogenizer is offset from the second homogenizer by a distance of about 1 mm.

13. The image projection system of claim 7, wherein a first scan field of the first digital micromirror device aligns or overlaps with a second scan field of the second digital micromirror device by about 5 pixels to about 1,000 pixels.

14. An image projection system, comprising:
a light source configured to output a light beam;
a fiber bundle coupled to the light source;
a first homogenizer coupled to the fiber bundle;
a second homogenizer coupled to the fiber bundle, the second homogenizer being offset from the first homogenizer, wherein the first homogenizer and the second homogenizer are configured to split the light beam into a first split beam and a second split beam;
a first digital micromirror device optically and proportionally aligned with the first homogenizer;
a second digital micromirror device disposed adjacent to the first digital micromirror device within a plane, the second digital micromirror device being optically and proportionally aligned with the second homogenizer, wherein the first digital micromirror device is offset from the second digital micromirror device along a scan direction within the plane; and
a projection lens, wherein the first digital micromirror device and the second digital micromirror device are disposed between the projection lens and the fiber bundle,
wherein the first digital micromirror device and the second digital micromirror device are offset within an optical field of view of the projection lens, and
wherein the projection lens is configured to alter a path of the first split beam and a path of the second split beam when the first and second split beams pass through the projection lens.

15. The image projection system of claim 14, wherein a scan field of the first digital micromirror device overlaps or aligns with a scan field of the second digital micromirror device to eliminate a gap between the scan field of the first digital micromirror device and the scan field of the second digital micromirror device.

16. The image projection system of claim 14, further comprising one or more lenses disposed between the first and second digital micromirror devices and the first and second homogenizers.

17. The image projection system of claim 16, wherein the one or more lenses alter the path of the first split beam and the second split beam.

18. The image projection system of claim 14, further comprising:
a third homogenizer coupled to the fiber bundle, the third homogenizer being offset from the first and second homogenizers;
a fourth homogenizer coupled to the fiber bundle, the fourth homogenizer being offset from the first, second, and third homogenizers;
a third digital micromirror device disposed adjacent to the first digital micromirror device within the plane, the third digital micromirror device being optically aligned with the third homogenizer; and
a fourth digital micromirror device disposed adjacent to the second digital micromirror device within the plane, the fourth digital micromirror device being optically aligned with the fourth homogenizer.

19. The image projection system of claim 14, wherein the first homogenizer is offset from the second homogenizer by a distance of about 1 mm.

20. The image projection system of claim 14, wherein a first scan field of the first digital micromirror device aligns or overlaps with a second scan field of the second digital micromirror device by about 5 pixels to about 1,000 pixels.

* * * * *